United States Patent [19]

Nagaishi et al.

[11] Patent Number: 5,210,070
[45] Date of Patent: May 11, 1993

[54] PROCESS FOR PREPARING A SINGLE PHASE BI-CONTAINING SUPERCONDUCTING THIN OXIDE FILM BY LASER ABLATION

[75] Inventors: Tatsuoki Nagaishi; Hisao Hattori; Hideo Itozaki, all of Hyogo, Japan

[73] Assignee: Sumitomo Electric Industries, Ltd., Japan

[21] Appl. No.: 792,179

[22] Filed: Nov. 14, 1991

[30] Foreign Application Priority Data

Nov. 15, 1990 [JP] Japan .................................. 2-309453
Nov. 15, 1990 [JP] Japan .................................. 2-309454
Oct. 24, 1991 [JP] Japan .................................. 3-305215

[51] Int. Cl.$^5$ .......................... B05D 3/06; B05D 5/12
[52] U.S. Cl. ........................................ 505/1; 505/732; 505/730; 427/62; 427/314; 427/584
[58] Field of Search .......................... 505/1, 732, 730; 427/62, 63, 53.1, 54.1, 314

[56] References Cited

FOREIGN PATENT DOCUMENTS 451782 10/1991 European Pat. Off. .

OTHER PUBLICATIONS

Applied Physics Letters, vol. 55, No. 20, Nov. 13, 1989, pp. 2123-2125, New York, US; Ivanov Z. et al: "Superconducting (Bi,Pb)-Ca-Sr-Cu-O Thin Films Prepared in Situ by Laser Ablation".
Applied Physics Letters, vol. 51, No. 8, Aug. 24, 1987, pp. 619-621, New York, US; D. Dijkkamp et al: "Preparation of Y-Ba-Cu Oxide Superconductor Thin Films Using Pulsed Laser Evaporation From High Tc Bulk Material".
Physica C, vol. 170, No. 5, Oct. 1, 1990, pp. 545-551, Amsterdam, NL; Brousse T., et al: "Laser Ablated Bismuth Cuprate Thin Films. Preparation and Effect of Oxygen Nonstochiometry Upon Superconductivity".
Ohya et al., "C-Axis Lattice Spacing Control of As--Grown Bi -Sr-Ca-Cu-O Thin Films by Single-Target Excimer Laser Ablation", Jpn. J. Appl. Phys. 28(6) Jun. 1989 pp. L978-L980.
Krebs et al., "Conditions for oriented growth of Y-Ba-Cu -O and Bi-Sr-Ca-Cu-O films by pulsed laser ablation", J. Appl. Phys. 69(4) Feb. 1991 pp. 2405-2409.

Primary Examiner—Shrive Beck
Assistant Examiner—Roy V. King
Attorney, Agent, or Firm—Lowe, Price, LeBlanc & Becker

[57] ABSTRACT

A process of preparing a superconducting thin oxide film includes irradiating a target containing Bi, Sr, Ca and Cu with a laser beam to prepare a thin film of superconducting $Bi_2Sr_2Ca_2Cu_3O_x$ oxide or a thin film of superconducting $Bi_2Sr_2Ca_1Cu_2O_y$ oxide on a substrate. The process is characterized in that the target containing Bi, Sr, Ca and Cu in an atomic ratio of 2:2:2:3 is positioned to face the substrate, and the laser beam is irradiated to the target in an atmosphere having an oxygen partial pressure of 0.01-1 Torr while the temperature of the substrate is maintained in a given temperature range suitable for growing the respective superconducting thin oxide films.

5 Claims, 1 Drawing Sheet

PROCESS FOR PREPARING A SINGLE PHASE BI-CONTAINING SUPERCONDUCTING THIN OXIDE FILM BY LASER ABLATION

BACKGROUND OF THE INVENTION

The present invention relates to a process for preparing a superconducting thin oxide film. More particularly, the present invention relates to a process that uses a laser ablation method to prepare a high-quality thin film of a Bi based oxide superconductor with good properties in reproduction.

Bi—Sr—Ca—Cu—O based oxide superconductors are known to have a critical temperature of about 100K which is higher than that of Y—Ba—Cu—O based oxide superconductors. However, the probability that a $Bi_2Sr_2Ca_1Cu_3O_x$ phase of a high critical temperature is produced simultaneously with a phase of low critical temperature that is typified by a $Bi_2Sr_2Ca_2Cu_2O_y$ is high. Therefore, the temperature at which electric resistance becomes completely zero is low although the resistance starts to decrease at high temperature.

Oxide superconductors must be formed as a highly crystalline thin film in order to use them in superconducting devices such as Josephson devices and superconducting base o transistors. In other words, the individual layers of a superconducting device are preferably made of single-crystal thin films and the characteristics of the superconducting device will deteriorate extremely if it contains a layer of low crystallinity.

A laser ablation method is a technique in which a target of starting material is irradiated with a laser beam in a vacuum atmosphere to generate a plasma so that a thin film grows on a substrate. Since electromagnetic fields of any kind are not required, the laser ablation method is considered to be suitable for preparing thin films of high-quality.

While various types of lasers can be used as light sources, an excimer laser ablation method that uses an excimer laser as a light source is capable of preparing thin films at a high rate and yet at low substrate temperature since the laser beam used has high-energy in a short wavelength range from 150 nm to 400 nm. This method has the following additional advantages and has attracted the attention as a technique adapted for preparing thin films of oxide superconductors which are multi-component compounds:

(1) a thin film having no compositional mismatch from the target can be obtained;
(2) film formation can be effected over a broad range of pressures up to about 1 Torr;
(3) the growth rate can be increased to an extremely high level; and
(4) the reaction involved is a non-thermal equilibrium process under illumination with high-energy light.

Therefore, the excimer laser ablation method is expected to be a technique suitable for preparing high-quality thin films of Bi—Sr—Ca—Cu—O based oxide superconductors.

Conventional Bi—Sr—Ca—Cu—O based oxide superconductors, whether in a bulk or thin film form, have had the problem of poor superconducting characteristics since two phases having different critical temperatures will be produced simultaneously. In particular, for applications in superconductor devices where high crystallinity is required, Bi—Sr—Ca—Cu—O based oxide superconductors have been seldom used because of the difficulty involved in preparing single-phase superconductors.

Even if the excimer laser ablation method is used in the preparation of superconducting thin films of Bi—Sr—Ca—Cu—O based oxides, it has been difficult to make the composition of the target correctly reflected in the product thin film because of the reevaporation of the element, thus making it impossible to prepare thin films having a constant composition.

SUMMARY OF THE INVENTION

The present invention has been achieved under these circumstances and has an object to provide a process by which superconducting films of Bi—Sr—Ca—Cu—O based oxide having a given composition can be prepared in a constant manner.

According to the present invention, a process of preparing a superconducting thin oxide film comprises irradiating a target containing Bi, Sr, Ca and Cu with a laser beam to prepare a thin film of superconducting $Bi_2Sr_2Ca_2Cu_3O_x$ oxide or a thin film of superconducting $Bi_2Sr_2Ca_1Cu_2O_y$ oxide on a substrate, which is characterized in that the target containing Bi, Sr, Ca and Cu is positioned to face the substrate, and the laser beam is irradiated to the target in an atmosphere having an oxygen partial pressure of 0.01-1 Torr while the temperature of the substrate is maintained in a given temperature range suitable for growing the respective superconducting thin oxide films.

The process of the present invention uses a laser ablation method to prepare a thin film of superconducting Bi—Sr—Ca—Cu—O based oxide and principally characterized in that the target is made of an oxide containing Bi, Sr, Ca and Cu, and thin film of superconducting $Bi_2Sr_2Ca_2Cu_3O_x$ oxide or a thin film of superconducting $Bi_2Sr_2Ca_1Cu_2O_y$ oxide is prepared on a substrate by varying the temperature of the substrate. That is, according to the process of the present invention, the superconducting thin oxide films made of different Bi—Sr—Ca—Cu—O based oxide superconductors can be formed from the same starting target. In the process of the present invention, it is preferable to prepare the film in the atmosphere having an partial pressure of 0.01-1 Torr.

When a thin film of superconducting $Bi_2Sr_2Ca_2Cu_3O_x$ oxide is prepared according to the process of the present invention, it is preferable that the surface temperature of the substrate is 610°-670° C., and when a thin film of superconducting $Bi_2Sr_2Ca_1Cu_2O_y$ oxide is prepared, it is preferable that the surface temperature of the substrate is 680°-750° C. A measurement value of temperature of the substrate may be different according to a measuring method, and the difference may be up to ±40° C. In the process of the present invention, the temperature of the substrate is measured by a sheath thermocouple calibrated by a normal thermocouple, and a value obtained by contacting the sheath thermocouple to the surface of the substrate to measure is made a standard.

DETAILED DESCRIPTION OF THE INVENTION

Figure 1:
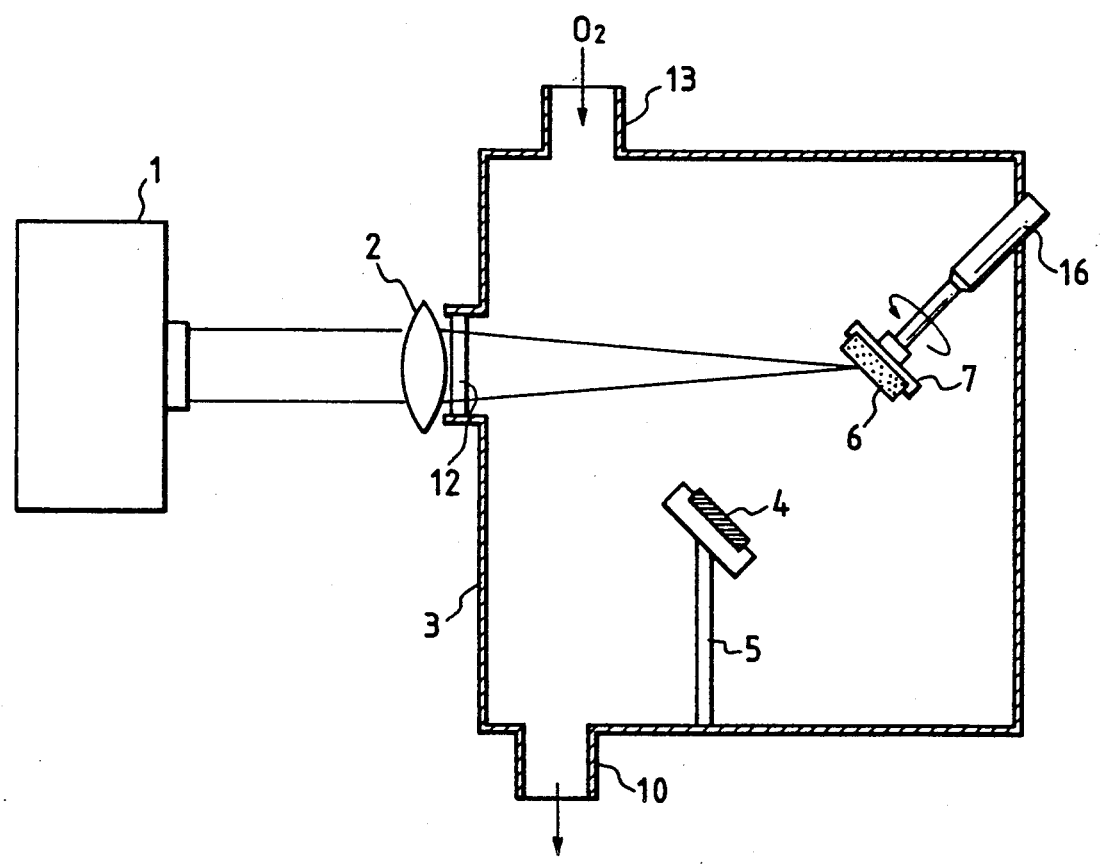
FIG. 1 shows diagrammatically an example of the laser ablation equipment that is used to implement the process of the present invention.

The preferred embodiments of the present invention will be described in detail. The embodiments given here are for illustrative purposes only and should in no way be taken to limit the technical scope of the invention.

FIG. 1 shows diagrammatically an example of the laser ablation equipment that can be used to implement the process of the present invention. The laser ablation equipment shown in FIG. 1 comprises a chamber 3 having a laser admitting window 12, an oxygen inlet 13 and a gas outlet 10 through which the interior of the chamber can be evacuated to high vacuum, a substrate holder 5 that is placed within the chamber 3 and that is equipped with a substrate heater (not shown), and a target holder 7 rotatable with a motor 16.

An excimer laser apparatus 1 and a condenser lens 2 for collecting the laser beam are positioned outside the chamber 3.

The laser beam emitted from the laser apparatus 1 is collected by the condenser lens 2 to be admitted into the chamber 3 through the window 12 so that it illuminates a target 6 of starting material fixed on the target holder 7 The laser beam is focused in such a way that it illuminates a slightly off-centered position of the target 6. Since the target 6 is rotatable by means of the motor 16, there is no possibility with the equipment shown in FIG. 1 that the target 6 is unevenly illuminated with the laser beam.

Using the equipment described above, a superconducting thin oxide film was prepared by the process of the present invention.

EXAMPLE 1

A single crystal of MgO was used as the substrate 4 in the equipment of FIG. 1. The target 6 was a disk of sintered powder containing Bi, Sr, Ca and Cu in a Bi:Sr:Ca:Cu atomic ratio of 2:2:2:3. For the preparation of a superconducting thin oxide film, the distance between the substrate 4 and the target 6 was adjusted to 50 mm while the temperature of the substrate surface was set at 650° C. Temperature measurement was conducted using a sheath thermocouple calibrated with a normal thermocouple.

After evacuating the chamber 3 to $1 \times 10^{-7}$ Torr, oxygen gas was introduced through the inlet 13 to increase the pressure to 0.4 Torr. Subsequently, an excimer laser beam was applied to the target surface at 1.5 J/cm$^2$ and 1 Hz and film formation was performed for 10 min. Immediately thereafter, current application to the heater was ceased for rapid cooling.

By X-ray diffraction, the formed superconducting film was verified to be composed of a single-phase oxide superconductor of $Bi_2Sr_2Ca_2Cu_3O_x$ oriented in c-axis.

EXAMPLE 2

A single crystal of MgO was used as the substrate 4 in the equipment of FIG. 1 as in example 1. The target 6 was a disk of sintered powder containing Bi, Sr, Ca and Cu in a Bi:Sr:Ca:Cu atomic ratio of 2:2:2:3. For the preparation of a superconducting thin oxide film the distance between the substrate 4 and the target 6 was adjusted to 50 mm as in example 1, while the temperature of the substrate surface was set at 700° C. Temperature measurement was conducted using a sheath thermocouple calibrated with a normal thermocouple.

After evacuating the chamber 3 to $1 \times 10^{-7}$ Torr, oxygen was introduced through the inlet 13 to increase the pressure to 0.4 Torr. Subsequently, an excimer laser beam was applied to the target surface at 1.5 J/cm$^2$ and 1 Hz and film formation was performed for 10 min. Immediately thereafter, current application to the heater was ceased for rapid cooling.

By X-ray diffraction, the formed superconducting film was verified to be composed of a single-phase oxide superconductor of $Bi_2Sr_2Ca_1Cu_2O_y$.

As described above, the process of the present invention insures that high-quality superconducting thin films of $Bi_2Sr_2Ca_2Cu_3O_x$ oxide and $Bi_2Sr_2Ca_1Cu_2O_y$ oxide which have heretofore been unattainable, are prepared by the laser ablation method. The superconducting thin oxide films prepared by the process of the present invention are optimal for use in electronic devices such as Josephson devices and superconducting transistors.

What is claimed is:

1. A process of preparing a single phase superconducting oxide film, comprising the steps of:

preparing a target of an oxide containing Bi, Sr, Ca and Cu, the atomic ratio of Bi:Sr:Ca:Cu in the target being 2:2:2:3;

positioning said target to face a substrate in a chamber;

adjusting an atmosphere in said chamber to have an oxygen partial pressure of 0.01-1 Torr;

heating a surface of said substrate;

irradiating said target with a laser beam; and depositing a single phase superconducting oxide film of Bi, Sr, Ca and Cu on said substrate.

2. A process according to claim 1, wherein said substrate is heated to the surface temperature of 610°-670° C. so that a single phase film of superconducting $Bi_2Sr_2Ca_2Cu_3O_x$ oxide is prepared on said substrate.

3. A process according to claim 1, wherein said substrate is heated to the surface temperature of 680°-750° C. so that a single phase film of superconducting $Bi_2Sr_2Ca_1Cu_2O_y$ oxide is prepared on said substrate.

4. A process according to claim 2, wherein said target is irradiated with an excimer laser beam of about 1.5 J/cm$^2$ and 1 Hz.

5. A process according to claim 3, wherein said target is irradiated with an excimer laser beam of about 1.5 J/cm$^2$ and 1 Hz.

* * * * *